United States Patent
Jewler (10) Patent No.: US 9,786,574 B2
(45) Date of Patent: Oct. 10, 2017

(54) THIN FILM BASED FAN OUT AND MULTI DIE PACKAGE PLATFORM

(71) Applicant: GLOBALFOUNDRIES Inc., Grand Cayman (KY)

(72) Inventor: Scott Jewler, Saratoga, CA (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/718,314

(22) Filed: May 21, 2015

(65) Prior Publication Data

US 2016/0343633 A1 Nov. 24, 2016

(51) Int. Cl.
| | |
|---|---|
| H01L 21/768 | (2006.01) |
| H01L 23/31 | (2006.01) |
| H01L 21/48 | (2006.01) |
| H01L 23/498 | (2006.01) |
| H01L 25/10 | (2006.01) |

(52) U.S. Cl.
CPC ........ *H01L 23/3128* (2013.01); *H01L 21/486* (2013.01); *H01L 21/4853* (2013.01); *H01L 23/49827* (2013.01); *H01L 23/49838* (2013.01); *H01L 23/49866* (2013.01); *H01L 23/49894* (2013.01); *H01L 25/105* (2013.01); *H01L 2224/18* (2013.01); *H01L 2224/48227* (2013.01); *H01L 2924/15311* (2013.01); *H01L 2924/181* (2013.01)

(58) Field of Classification Search
CPC ............ H01L 21/786; H01L 21/76804; H01L 21/3114; H01L 21/49827
See application file for complete search history.

(56) References Cited

U.S. PATENT DOCUMENTS

| | | | |
|---|---|---|---|
| 8,552,556 B1 | 10/2013 | Kim et al. | |
| 2003/0178474 A1* | 9/2003 | Jiang | H01L 21/563 228/205 |
| 2005/0136635 A1* | 6/2005 | Savastiouk | H01L 23/13 438/597 |
| 2014/0339696 A1 | 11/2014 | Yu et al. | |
| 2015/0179560 A1* | 6/2015 | Arisaka | H05K 1/0366 257/777 |

OTHER PUBLICATIONS

Texas Instruments Incorporated "MicroStar BGA Packaging Reference Guide", Third Edition—Sep. 2000, 64 pages.

(Continued)

*Primary Examiner* — Michael Carter
(74) *Attorney, Agent, or Firm* — Ditthavong & Steiner, P.C.

(57) ABSTRACT

Thin film based fan out wafer level packaging and a method of manufacturing the same are disclosed. Embodiments include a method including forming tapered via holes in a first surface of a polymer film; forming a conductive pillar on the first surface of a semiconductor device; bonding a solderable surface of the conductive copper pillars to metallization on the second side of the polymer film; bonding the semiconductor device to the first surface of the polymer film over the conductive pillars with an underfill material; and depositing an encapsulant material over the semiconductor device and polymer film.

11 Claims, 8 Drawing Sheets

(56) References Cited

OTHER PUBLICATIONS

STATSChipPAC, "eWLB (F0WLP Technology) Embedded Wafer Level Ball Grid Array", Aug. 2014, 2 pages.
TSMC, "Wafer Level Chip Scale Package Services", retrieved on Jun. 24, 2015 from http://www.tsmc.com/english/dedicatedFoundry/services/wlcsp.htm, 1 page.
Taiwanese Office Action for related Taiwanese Patent Application No. 105106863 dated May 25, 2017, 5 Pages.

\* cited by examiner

FIG. 7

THIN FILM BASED FAN OUT AND MULTI DIE PACKAGE PLATFORM

TECHNICAL FIELD

The present invention relates to post wafer fabrication. The present disclosure is particularly applicable to thin film based fan out wafer level packaging and a method of manufacturing the same.

BACKGROUND

The semiconductor far back end assembly and packaging industry is in need of a low cost packaging solution for higher interconnect density and smaller form factor for mobile and internet-of-things (IoT) applications as well as others. One existing solution is fan out wafer level chip scale packaging (FOWLCSP). While this solution has been deployed on a limited basis, it has a high cost and limited scalability. A goal with this solution is to move from a 330 millimeter (mm) diameter round substrate to a 500×500 mm square substrate for cost reduction. However, this solution also has an inherent disadvantage of handling large thin panels as well as pattern run out across the panel. Both of these disadvantages drive higher manufacturing tool costs and minimize any potential savings associated with this solution.

Figure 1A:
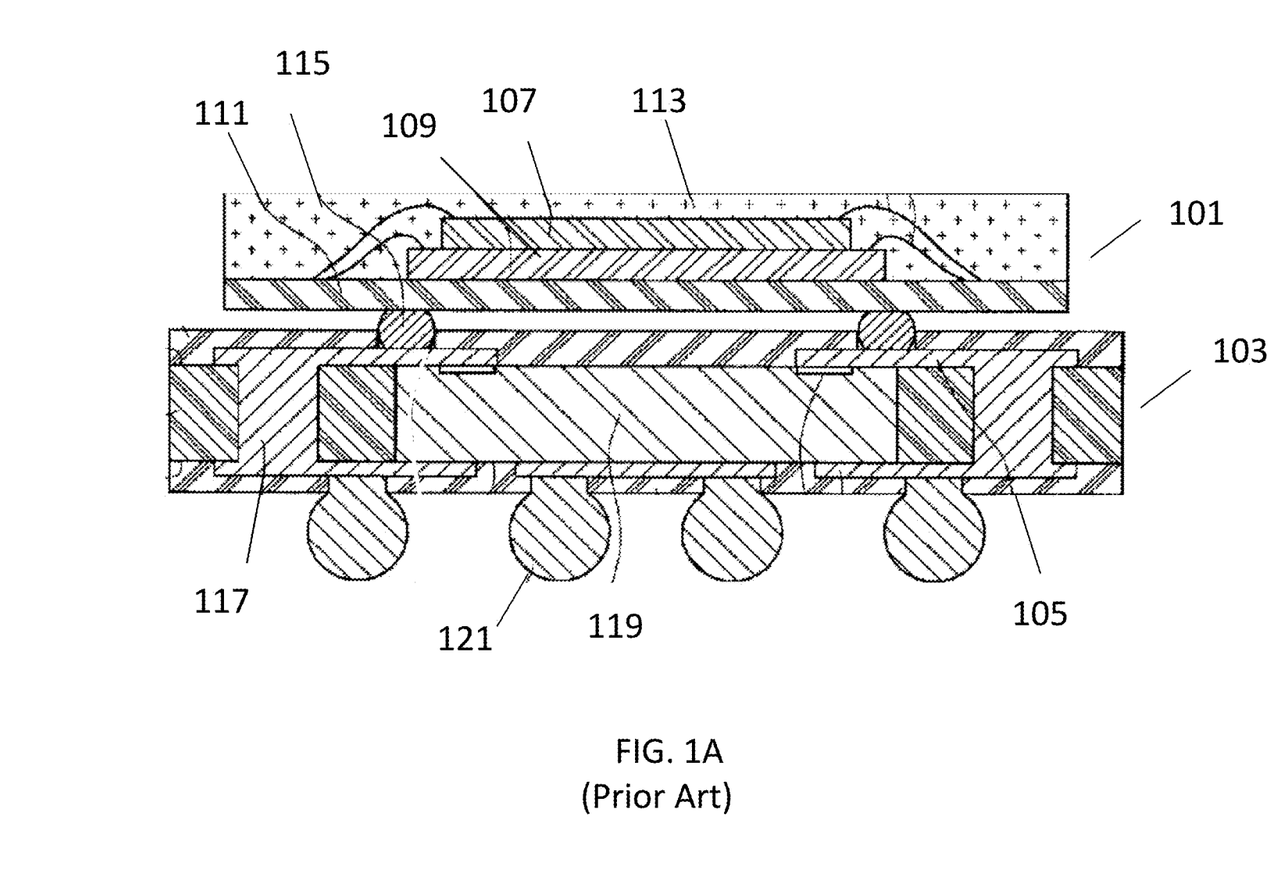
FIG. 1A is a cross-sectional view illustrating a conventional FOWLCSP in a PoP configuration.

An example of a conventional FOWLCSP in a package on package (PoP) configuration is illustrated in FIG. 1A. PoP wafer level fan out package includes a stack package 101 and wafer level fan out package 103. Stack package 101 such as a memory or a chip size package may be coupled to an electrically conductive pattern 105 of the wafer level fan out package 103. The stack package 101 includes first and second semiconductor dies 107, 109, substrate 111, an encapsulant 113, and solder balls 115. The solder balls 115 are coupled to the electrically conductive pattern 105. Wafer level fan out package 103 further includes conductive vias 117, semiconductor die 119, and solder balls 121. Chip suppliers and mobile product manufacturers desire increased functionality of products by increasing silicon content and interconnects between silicon chips, while at the same time maintaining low costs, producing thin products with a small footprint package.

Figure 1B:
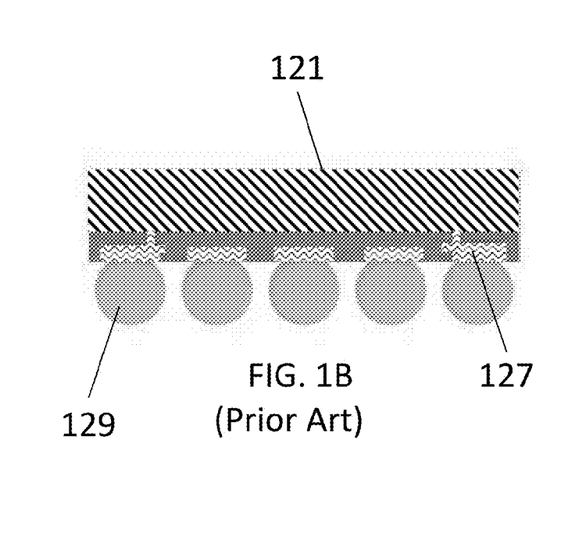
FIG. 1B is cross-sectional view illustrating a conventional fan-in wafer level package.
Figure 1C:
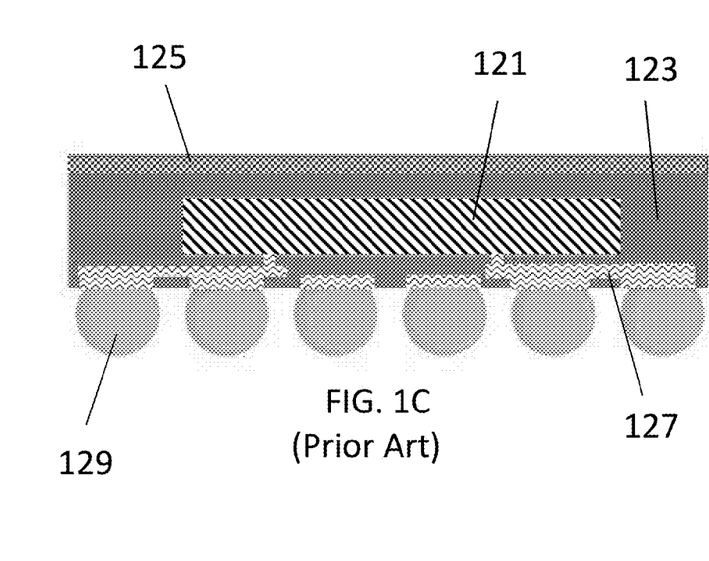
FIG. 1C is a cross-sectional view illustrating a conventional fan-out wafer level package.

FIG. 1B is an example of a conventional fan-in wafer level package having a silicon die, 121, bump or land connections 129 and metal conductors 127. FIG. 1C is an example of a wafer level fan out package including a silicon die 121 that is typically encapsulated in an epoxy based thermoset material 123. Unlike conventional wafer level packages of FIG. 1B, where all the connections from the package to the next level of interconnect such as a system or module level printed circuit board must be contained within the area of the surface of the silicon die 121 itself, conventional fan out wafer level chip scale packaging of FIG. 1C utilizes the encapsulation material 123 as an extension onto which dielectric material 125 and metal conductors 127 can be patterned extending interconnect to next level with a larger quantity of bump or land connections 129 and/or a larger pitch between connections.

A need therefore exists for methodology enabling utilization of mature film based technology to create a thinner package at reduced cost by using lower cost manufacturing equipment and which does not depend on panel based processing that drives higher manufacturing equipment costs and results in total manufacturing costs that exceed the markets ability to pay.

SUMMARY

An aspect of the present disclosure is a method of forming a patterned polymer film, such as a polyimide film, to create a high density interconnect from a chip to another chip, or from a chip to an external bonding point.

Another aspect of the present disclosure is a patterned polymer film, such as a polyimide film, to create a high density interconnect from a chip to another chip, or from a chip to an external bonding point.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method of fabricating a semiconductor device, the method including forming tapered via holes in a first surface of a polymer film; forming a conductive pillar on the first surface of a semiconductor device; bonding a solderable surface of the conductive copper pillars to metallization on the second side of the polymer film; bonding the semiconductor device to the first surface of the polymer film over the conductive pillars with an underfill material; and depositing an encapsulant material over the semiconductor device and polymer film.

Aspects of the present disclosure include forming the tapered via holes in the first surface of the polymer film with laser ablation or etching. Other aspects include the polymer film including a polyimide. Another aspect includes the metallization on the second surface of the polymer film includes electrically conductive patterns on the second surface of the polymer film; the tapered via holes terminate at the electrically conductive pattern; the conductive pillars on the first surface of the semiconductor device have positions corresponding to those of the tapered via holds on the first surface of a polymer film; the semiconductor device is electrically connected to the electrically conductive patterns on the second surface of the polymer film using the tapered via holes to position and align the semiconductor device with corresponding via holes. Yet other aspects include subjecting the second surface of the polymer film to copper patterning; and forming solder bumps on the second surface of the polymer film after the copper patterning. Another aspect includes the solder bumps comprise tin (Sn) and silver (Ag). Further aspects include the underfill material including a no flow underfill material. Other aspects include curing the no flow underfill material after bonding the semiconductor device. Yet other aspects include encapsulating the semiconductor device on four sides leaving the second surface of the semiconductor device exposed or encapsulating the semiconductor device on five sides covering the second surface of the semiconductor device. Other aspects include forming the tapered via holes to have a first diameter proximate to the semiconductor device and a second diameter remote from the semiconductor device, the first diameter being larger than the second diameter. The conductive pillars have a third diameter smaller than the first and second diameters of the tapered via holes, the conductive pillars comprises a solderable material comprising Sn—Ag on a surface of the pillar not in contact with the semiconductor device, a height of the conductive pillar and solderable material is similar to a thickness of the polymer film, such that when the semiconductor device is bonded to the polymer film a distance between the first surface of the semiconductor device and the first surface of the polymer film is equal to a desired thickness of underfill material. Another aspect includes depositing and patterning a dielectric layer on the second surface of the polymer film prior to forming the solder bumps.

Another aspect of the present disclosure is a device including: a polymer film having tapered vias formed therein; a semiconductor device having conductive pillars with deposited solder on a surface opposite the semiconductor device and the conductive pillars being bonded to a first surface of the polymer film over the conductive pillars with an underfill material; and an encapsulant material deposited over the semiconductor device and polymer film, wherein the underfill material bonds a surface of the semiconductor device to the first surface of the polymer film to permit movement during temperature cycling.

Aspects include the encapsulant material including an epoxy molding. Other aspects include the underfill material including a cured no flow underfill material. Yet other aspects include the conductive pillars including Cu. Further aspects include the polymer film including a polyimide.

Other aspects include the use of multiple layers of polymer film and multiple layers of patterned conductors where layers of conductors may be connected by use of conductive vias either between two adjacent layers of conductors or between non-adjacent layers of conductors. By adding multiple layers of polymer film and conductive patterns, the interconnect density between chips or from a chip to its next bonding point can be increased.

Other aspects include a method including: forming tapered via holes in a first surface of a polyimide film with laser ablation or etching, the tapered via holes having a first diameter proximate the first surface of the polyimide film and second diameter remote from the first surface, the first diameter being larger than the second diameter; forming a conductive pillar in each of the tapered via holes each conductive pillar being clad to the polyimide film or adhesively attached to the polyimide film; bonding a semiconductor device to the first surface of the polyimide film over the conductive copper pillars with a no flow underfill material; depositing an epoxy molding material as an encapsulant over the semiconductor device and polyimide film.

Aspects include curing the no flow underfill material after bonding of the semiconductor device. Other aspects include subjecting a second surface of the polymer film to copper patterning; and forming solder bumps on the second surface of the polymer film after the copper patterning. Further aspects include depositing and patterning a dielectric layer on the second surface of the polyimide film prior to forming the solder bumps.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 5 schematically illustrate cross sectional views of a process flow to produce a thin film based fan out and multi die package, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of large thin panels as well as pattern run out across the panel attendant upon panel based processing of fan out WLCSP which has the inherent disadvantage of handling. In accordance with embodiments of the present disclosure, a mature film based technology is used to create a thinner package at a lower cost.

Methodology in accordance with embodiments of the present disclosure includes forming tapered via holes in a first surface of a polymer film. A conductive pillar is formed in each of the tapered via holes. A semiconductor device is bonded to the first surface of the polymer film over the conductive pillars with an underfill material. An encapsulant material is formed over the semiconductor device and polymer film Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 2A:
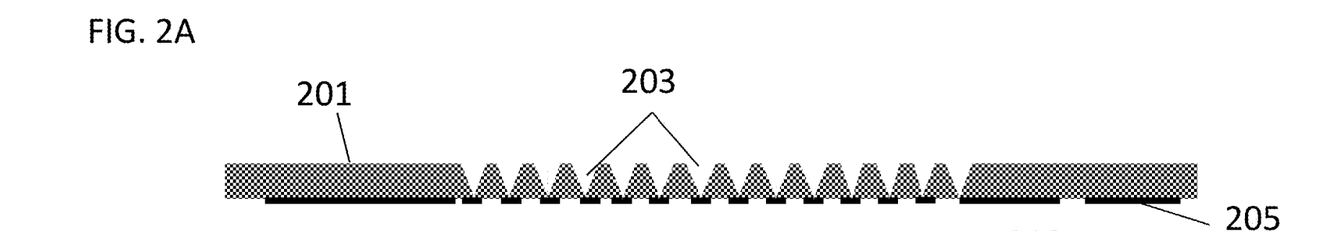

Adverting to FIG. 2A, a polymer film 201 is illustrated. The polymer film 201 has a high thermostability (e.g., high heat-resistance). An example of a polymer used in the film is a polyimide which is a polymer of imide monomers. Polyimides are known for thermal stability, good chemical resistance, and excellent mechanical properties. Polyimide films have good mechanical elongation and tensile strength, which also help the adhesion between the polyimide film and a deposited metal layer. In FIG. 2A, the polymer film contains vias 203 which are formed in the film by either etching or laser ablation. The polymer film has a thickness of 50 µm or less. Prior to forming the vias 203, a copper layer is adhered to the polymer film 201 and patterned to produce patterned copper film 205. The vias 203 are tapered via holes.

Figure 2B:
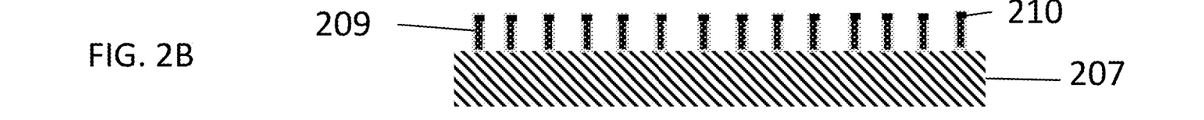
Figure 2C:
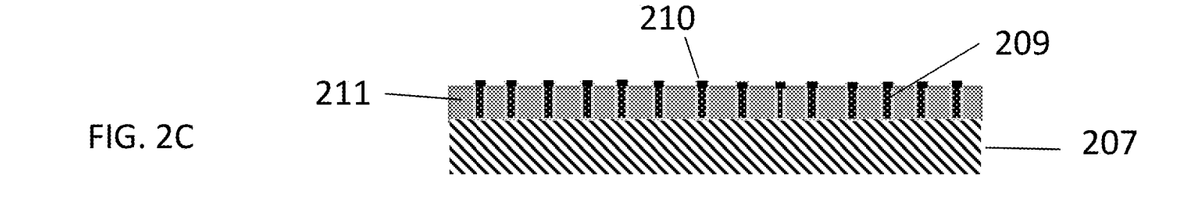

In FIG. 2B, conductive pillars 209 are formed on semiconductor device 207. The conductive pillars have a solderable material/cap 210 formed on a surface opposite to where the conductive pillar is attached to the semiconductor device. The conductive pillars include a Cu pillar body and a solderable material/cap 210 such as nickel (Ni), tin (Sn) or silver (Ag). The height of the Cu pillar and cap is about the same as the thickness of the polymer film. As shown in FIG. 2C, a thin layer, for example a layer 5 to 20 µm in thickness, of adhesive 211 is formed on the semiconductor device 207 between the Cu pillars 209 that will serve as an underfill of the final package. The underfill provides for strain management in the final package. A final package having a thickness of less than 100 µm is achievable.

Figure 3:
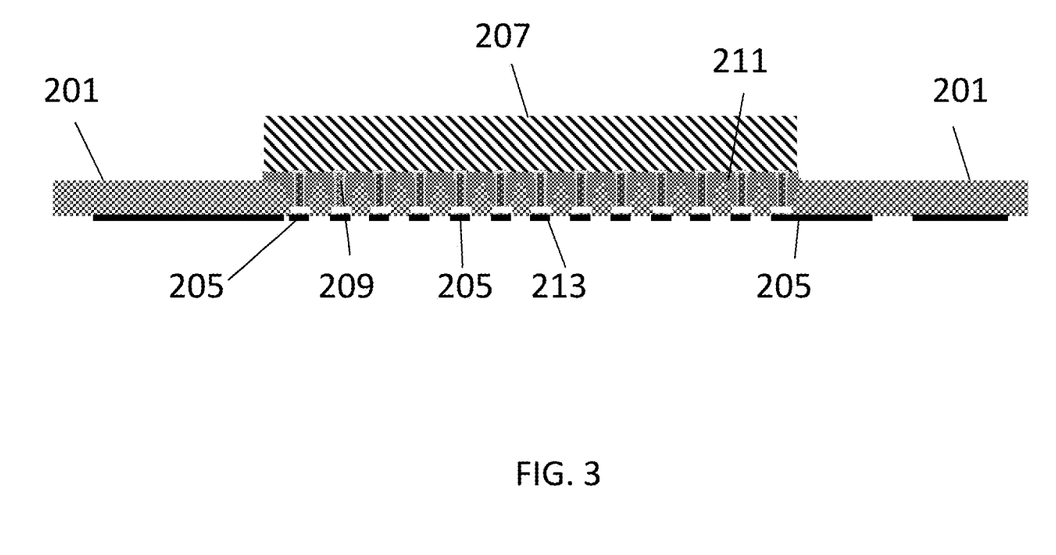

FIG. 3 illustrates semiconductor device (e.g., semiconductor chip) 207 bonded to the polymer film 201 with Cu pillars 209 protruding in the tapered via holes 203. Prior to bonding, a copper pad 213 may be exposed through the via holes 203 in the polymer film 201, and its surface may be coated with a barrier and solderable material such as Ni, Sn or Ag. Due to the tapered shape of via holes 203, the alignment of the Cu pillars 209 during bonding is improved. The tapered shape of the vias holes 203 help self align the Cu pillars 209 during bonding. The tapered via holes in the polymer film will provide for self alignment allowing for faster bonding speed and less costly placement equipment. The Cu pillars 209 protrude into the via holes 203 to create conductive vias when soldered to the patterned Cu film 205. The adhesive 211 is a no flow underfill material that bonds the semiconductor device surface to the polymer film 201 and which allows for movement between the to be applied solder bumps and the semiconductor device during temperature cycling. The Cu pillars 209 have a height approximately equal to the thickness of the polymer film 201. The semiconductor device 207 is positioned such that the Cu pillars 209 protrude into the via holes in the polymer film 201 and the solder caps of the Cu pillars 209 make contact with the solderable coating of the patterned copper film 205. The Cu pillars 209 and the patterned copper film 205 are soldered together by heating the solder caps of the Cu pillars 209 to the melting point of the solder caps while in contact with the Cu pillars 209 and the patterned copper film 205. The adhesive 211 (i.e., no flow underfill material) is thermally cured to secure the polymer film 201 to the surface of the semiconductor device 207. The adhesive 211 is an epoxy based material.

Figure 4:
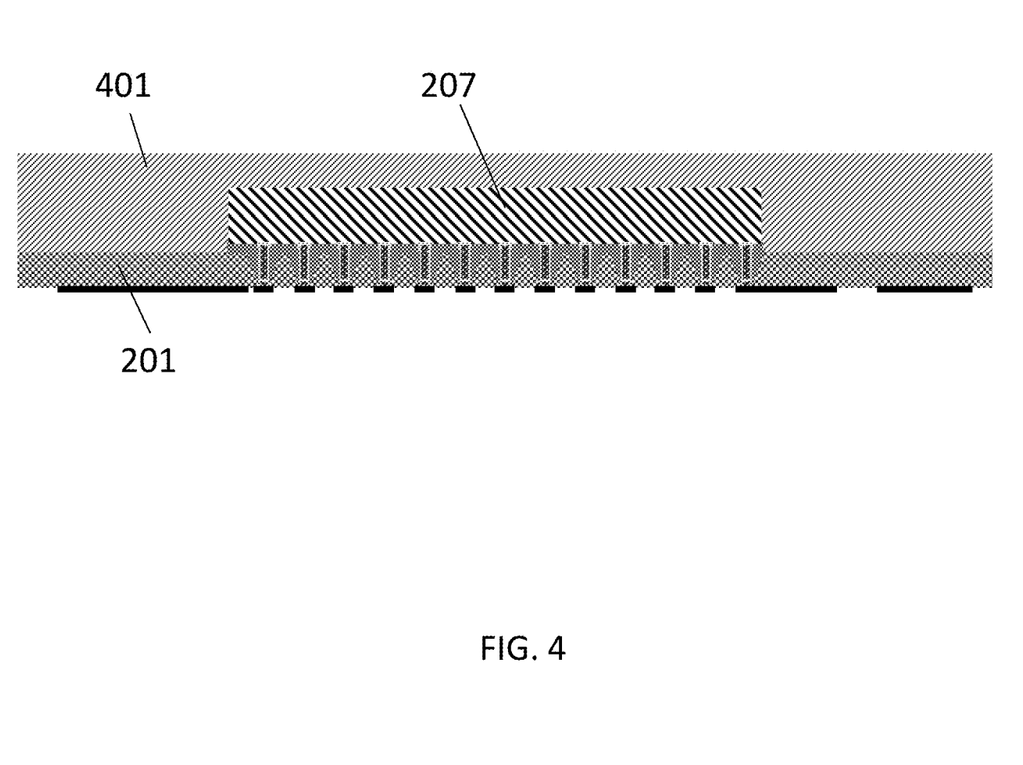
Figure 5:
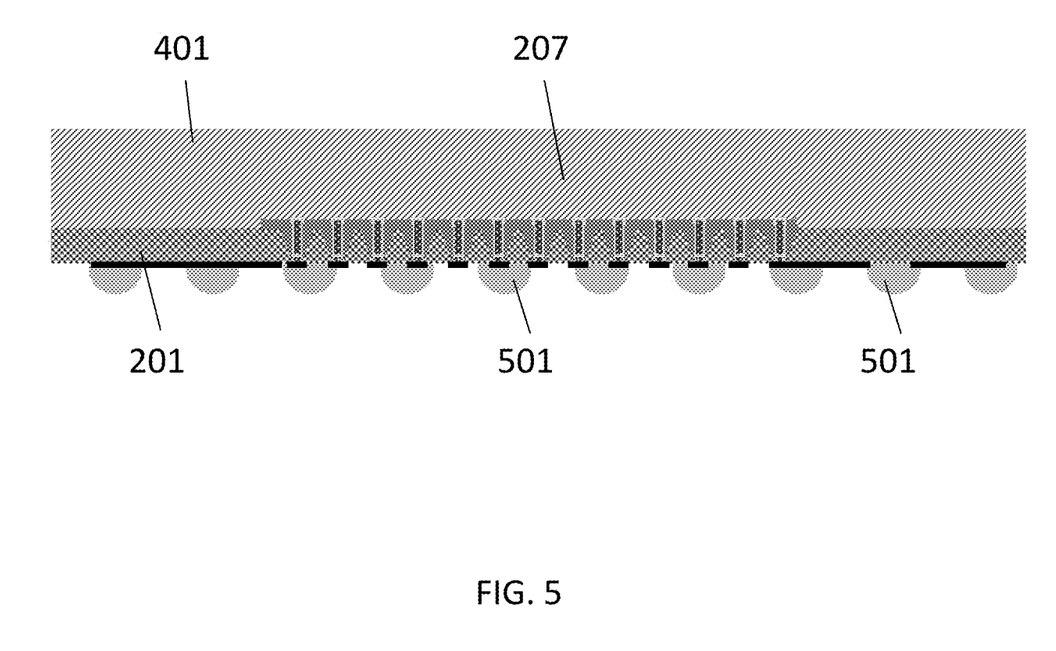

As shown in FIG. 4, an epoxy molding compound 401 is formed over the polymer film 201 and semiconductor device 207 to encapsulate them both. The encapsulation includes encapsulating the semiconductor device on four sides leaving the second surface of the semiconductor device exposed or encapsulating the semiconductor device on five sides covering the second surface of the semiconductor device. Adverting to FIG. 5, solder bumps 501 are applied to the surface of the polymer film 201 having the patterned copper film 205. The solder bumps 501 serve as a way to mount to semiconductor device 207 to matching pads of external circuitry such as a printed circuit board (PCB) or another semiconductor device/chip or wafer. The solder bumps may be made of Sn and Ag and other elements.

Figure 6A:
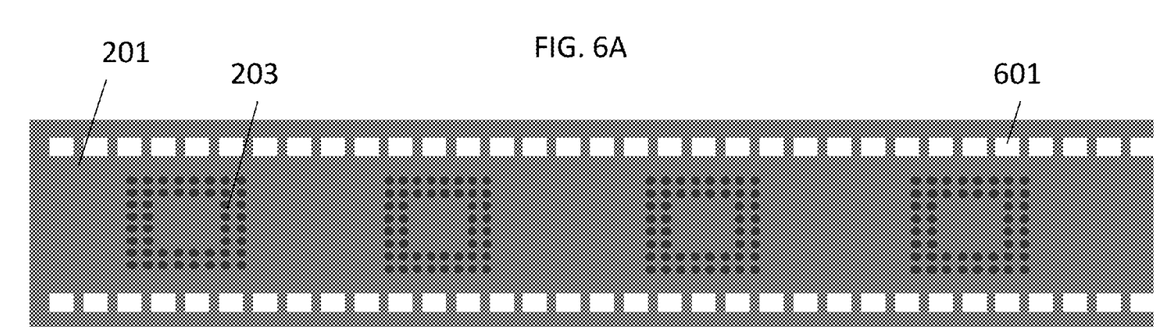
FIGS. 6A through 6C are top, side and bottom views, respectively, of the thin film structure, in accordance with an exemplary embodiment.
Figure 6B:
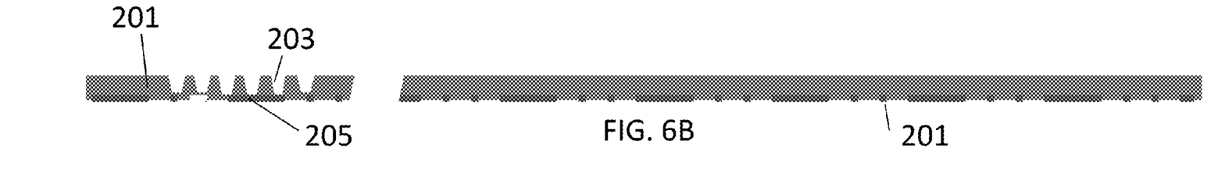
Figure 6C:
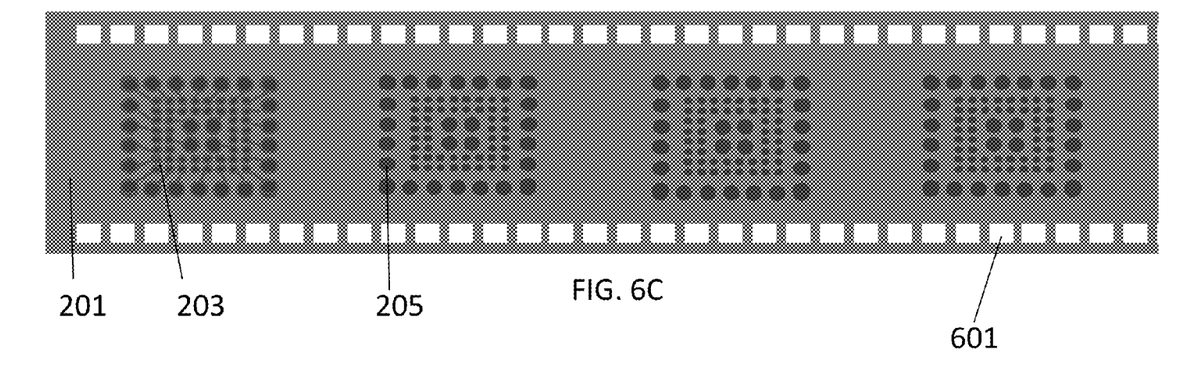

In FIGS. 6A, 6B and 6C, the top, side and bottom views are respectively shown for the thin film polymer structure. Polymer film 201 is shown with tapered via holes 203 formed therein and patterned Cu film 205 applied to a surface of the polymer film 201. A patterned dielectric layer (not shown) may be provided over the patterned Cu film 205. The dielectric layer may be applied to prevent wicking of the solder balls and prevent electrical shorting. The polymer film as shown in FIGS. 6A, 6B and 6C is provided in a film roll with perforations 601 along the side edges. Assembly can be done on existing manufacturing equipment as polymer strips/reels with tooling change.

Figure 7:
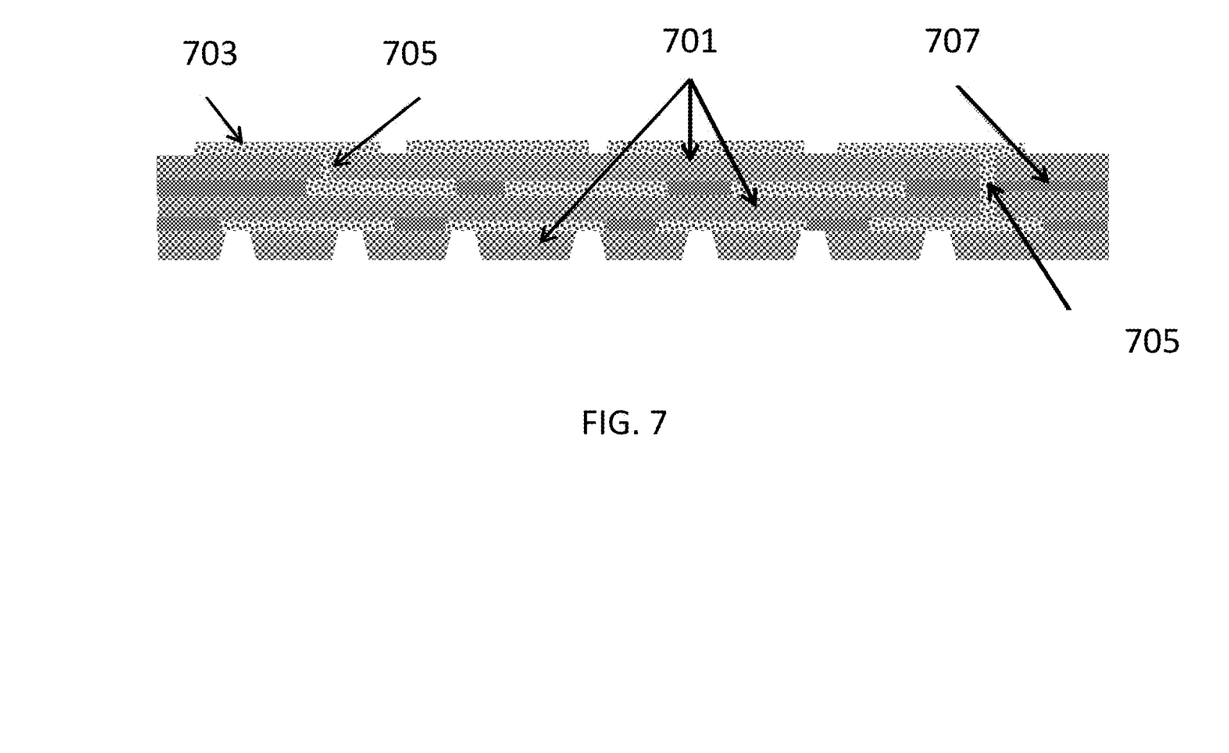
FIG. 7 illustrates a cross-sectional view of a structure with multiple layers of polymer film and multiple layers of patterned conductors.

FIG. 7 illustrates an example of the use of multiple layers of polymer film 701 and multiple layers of patterned conductors 703 where layers of conductors 703 may be connected by use of conductive vias 705 either between two adjacent layers of conductors 703 or between non-adjacent layers of conductors 703. Adhesive 707 is positioned between adjacent layers of polymer film 701. By adding multiple layers of polymer film 701 and conductive patterns 703, the interconnect density between chips or from a chip to its next bonding point can be increased.

The embodiments of the present disclosure can achieve several technical effects, such as increasing silicon content and interconnect between silicon chips at a lower coast and smaller footprint package. A single metal layer (or more than one) can be patterned with fine lines and spaces. Via hole formation in film is less costly than in other common materials used in semiconductor packaging. Cu pillar technology is a mature and cost effective technology and creating a post/pillar requires less plating time than filling an equivalent via with a seeded side wall. Film thickness in the present application can be 25 µm of less which is thinner than any other packaging substrate material and only slightly thicker than conventional build up patterning in FO-WLCSP. Using Cu pillars as vias allow for the thinnest possible final package (i.e., less than 100 µm) which is very desirable. Moreover, with the present application, the assembly can be done on existing manufacturing equipment as strips with tooling change or reel to reel line can used to achieve the lowest cost, similar to RFID tag. As discussed above, the taper of the film via holes provides for self alignment and allows for faster bonding speed and less costly placement equipment. In addition, by using commercially available film purchased in a volume need to support the quantity of final products desired will reduce capital risk associated with panel based FO-WLP solutions which depend on more costly manufacturing equipment and their associated fixed costs which do not change as a result of the quantity of products produced on a given machine.

Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices using thin film based fan out and multi die package platforms.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodi-

What is claimed is:

1. A method comprising:
    forming tapered via holes in a first surface of a polymer film, the polymer film having a second surface with metallization;
    forming conductive pillars on a first surface of a semiconductor device;
    bonding a solderable surface of the conductive pillars to the metallization on the second surface of the polymer film;
    bonding the semiconductor device to the first surface of the polymer film over the conductive pillars with an underfill material, the underfill material being in direct contact with a plurality of sides of each conductive pillar and filling a remainder of each tapered via hole; and
    depositing an encapsulant material over the semiconductor device and polymer film.

2. The method according to claim 1, comprising:
    forming the tapered via holes in the first surface of the polymer film with laser ablation or etching.

3. The method according to claim 2, wherein the polymer film comprises a polyimide.

4. The method according to claim 1, wherein:
    the metallization on the second surface of the polymer film includes electrically conductive patterns on the second surface of the polymer film;
    the tapered via holes terminate at the electrically conductive pattern;
    the conductive pillars on the first surface of the semiconductor device have positions corresponding to those of the tapered via holds on the first surface of a polymer film; and
    the semiconductor device is electrically connected to the electrically conductive patterns on the second surface of the polymer film using the tapered via holes to position and align the semiconductor device with corresponding via holes.

5. The method according to claim 4, wherein the second surface of the polymer film includes copper patterning; and
    forming solder bumps on the second surface of the polymer film after the copper patterning.

6. The method according to claim 5, wherein the solder bumps comprise tin (Sn) and silver (Ag).

7. The method according to claim 5, further comprising:
    depositing and patterning a dielectric layer on the second surface of the polymer film prior to forming the solder bumps.

8. The method according to claim 1, wherein the underfill material comprises a no flow underfill material.

9. The method according to claim 8, further comprising:
    curing the no flow underfill material after bonding the semiconductor device.

10. The method according to claim 1, further comprising:
    encapsulating the semiconductor device on four sides leaving the second surface of the semiconductor device exposed or
    encapsulating the semiconductor device on five sides covering the second surface of the semiconductor device.

11. The method according to claim 1, comprising forming the tapered via holes to have a first diameter proximate to the semiconductor device and a second diameter remote from the semiconductor device, the first diameter being larger than the second diameter,
    wherein the conductive pillars have a third diameter smaller than the first and second diameters of the tapered via holes,
    the conductive pillars comprises a solderable material comprising Sn-Ag on a surface of the pillar not in contact with the semiconductor device,
    a height of the conductive pillar and solderable material is substantially the same as a thickness of the polymer film, such that when the semiconductor device is bonded to the polymer film a distance between the first surface of the semiconductor device and the first surface of the polymer film is equal to a desired thickness of underfill material.

* * * * *